(12) United States Patent
Kokubun

(10) Patent No.: US 10,199,407 B2
(45) Date of Patent: Feb. 5, 2019

(54) LIGHT-RECEIVING DEVICE AND PHOTO-DETECTION APPARATUS WITH SUCH LIGHT-RECEIVING DEVICE

(71) Applicant: Kabushiki Kaisha Toshiba, Minato-ku, Tokyo (JP)

(72) Inventor: Koichi Kokubun, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/687,699

(22) Filed: Aug. 28, 2017

(65) Prior Publication Data

US 2018/0204860 A1   Jul. 19, 2018

(30) Foreign Application Priority Data

Jan. 13, 2017   (JP) ................. 2017-004145

(51) Int. Cl.

| | |
|---|---|
| H01L 31/107 | (2006.01) |
| H01L 27/144 | (2006.01) |
| H04N 5/33 | (2006.01) |
| H04N 5/225 | (2006.01) |
| H04N 5/369 | (2011.01) |
| H01L 31/02 | (2006.01) |
| H01L 31/0232 | (2014.01) |
| H01L 31/028 | (2006.01) |
| G01B 11/14 | (2006.01) |

(52) U.S. Cl.
CPC .... *H01L 27/1443* (2013.01); *H01L 31/02005* (2013.01); *H01L 31/028* (2013.01); *H01L 31/02027* (2013.01); *H01L 31/02327* (2013.01); *H01L 31/107* (2013.01); *H04N 5/2256* (2013.01); *H04N 5/332* (2013.01); *H04N 5/369* (2013.01); *G01B 11/14* (2013.01)

(58) Field of Classification Search
CPC .......... H01L 27/1443; H01L 31/02005; H01L 31/02027; H01L 31/02327; H01L 31/028; H01L 31/107; H04N 5/2256; H04N 5/332; H04N 5/369; G01B 11/14
See application file for complete search history.

(56) References Cited

U.S. PATENT DOCUMENTS

2013/0015331 A1   1/2013   Birk et al.

FOREIGN PATENT DOCUMENTS

| JP | 2013020972 A | 1/2013 |
|---|---|---|
| JP | 5185208 B2 | 4/2013 |
| JP | 2014013844 | 1/2014 |
| WO | 2010098201 A1 | 9/2010 |

*Primary Examiner* — Timor Karimy
(74) *Attorney, Agent, or Firm* — White & Case LLP

(57) ABSTRACT

A light-receiving device has a semiconductor substrate that includes a first pixel region that has a first thickness and a second pixel region that has a second thickness less than the first thickness. It has a plurality of first photoelectric conversion elements formed in the first pixel region and a first electrode where their outputs are supplied thereto. It has a plurality of photoelectric conversion elements formed in the second pixel region and a second electrode where their outputs are supplied thereto. It has a common electrode for the first and second photoelectric conversion elements.

19 Claims, 6 Drawing Sheets

US 10,199,407 B2

LIGHT-RECEIVING DEVICE AND PHOTO-DETECTION APPARATUS WITH SUCH LIGHT-RECEIVING DEVICE

CROSS-REFERENCE TO RELATED APPLICATIONS

This application is based upon and claims the benefit of priority from Japanese Patent Application No. 2017-4145, filed on Jan. 13, 2017; the entire contents of which are incorporated herein by reference.

FIELD

The present embodiment generally relates to a light-receiving device and a photo-detection apparatus with such a light-receiving device.

BACKGROUND

A technique of a light-receiving device is conventionally disclosed where series connections of a quenching resistance and an avalanche photodiode (APD) are connected in parallel to measure the number of incident photons. An APD is composed of silicon (Si), and hence, it is referred to as a Silicon Photomultiplier (SiPM).

It is expected that an SiPM will be adopted for a distance measurement system that uses a laser diode (LD) as a light source and measures a distance to a measurement object. A structure is proposed for improving a sensitivity of a photoelectric conversion element by thinning a film of a semiconductor substrate or providing a structure where a metal reflective film is provided therein. Furthermore, a structure is also proposed that uses a compound semiconductor substrate in order to improve a light-receiving sensitivity. However, thinning a film of a semiconductor substrate causes a restriction on, for example, formation of a bonding pad or the like, and a configuration that uses a compound semiconductor substrate provides a high cost. Furthermore, in a case where it is used for a distance measurement system, a multifunctional light-receiving device is desired that is also capable of providing distance information in addition to a high light-receiving sensitivity of a photoelectric conversion element. Furthermore, a light-receiving device is desired that is readily manufactured and is capable of reducing a cost thereof.

DETAILED DESCRIPTION

According to one embodiment, a light-receiving device has a semiconductor substrate that includes a first pixel region that has a first thickness and a second pixel region that has a second thickness less than the first thickness and that has a first surface and a second surface. It has a plurality of first photoelectric conversion elements formed on the first surface in the first pixel region. It has a first electrode where an output of the first photoelectric conversion element is supplied thereto. It has a plurality of second photoelectric conversion elements formed on the first surface in the second pixel region. It has a second electrode where an output of the second photoelectric conversion element is supplied thereto. It has a metal film that is formed on the second surface of the semiconductor substrate and used as a common electrode for the first and second photoelectric conversion elements.

Hereinafter, a light-receiving device according to an embodiment will be described in detail, with reference to the accompanying drawings. Additionally, the present invention is not limited by such an embodiment.

First Embodiment

Figure 1:
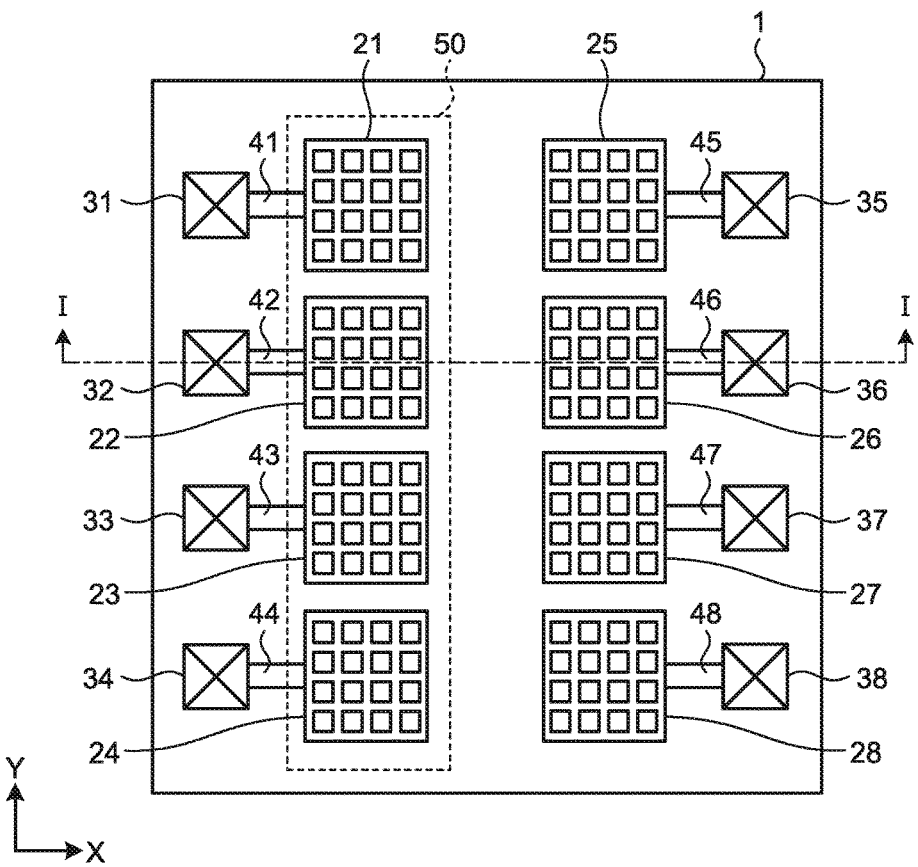
FIG. 1 is a plan view schematically illustrating a light-receiving device according to a first embodiment.

FIG. 1 is a plan view schematically illustrating a light-receiving device according to a first embodiment. A light-receiving device 1 has a plurality of pixel regions 21 to 28 where a plurality of photoelectric conversion elements is formed on a silicon semiconductor substrate. The pixel regions 21 to 24 are formed in a second region indicated by a dotted line 50. In a second region, a film thickness of a silicon semiconductor substrate is small. The pixel regions 25 to 28 are provided in a first region with a film thickness greater than that of a second region. That is, in the present embodiment, in directions of an X-axis and a Y-axis that is orthogonal thereto, a line where the pixel regions 21 to 24 formed in a region where a film thickness of a silicon semiconductor substrate is small are sequentially provided in a direction of the Y-axis and a line where the pixel regions 25 to 28 formed in a region where a film thickness of the silicon semiconductor substrate is large are sequentially provided in a direction of the Y-axis are formed in parallel to a direction of the X-axis.

The pixel regions 21 to 28 have electrode pads 31 to 38 where an output signal from a photoelectric conversion element is supplied thereto, respectively. The pixel regions 21 to 28 and the electrode pads 31 to 38 are connected by wires 41 to 48, respectively. The electrode pads 31 to 38 are, for example, bonding pads that are connected to external electrodes by bonding wires (non-illustrated).

Figure 2:
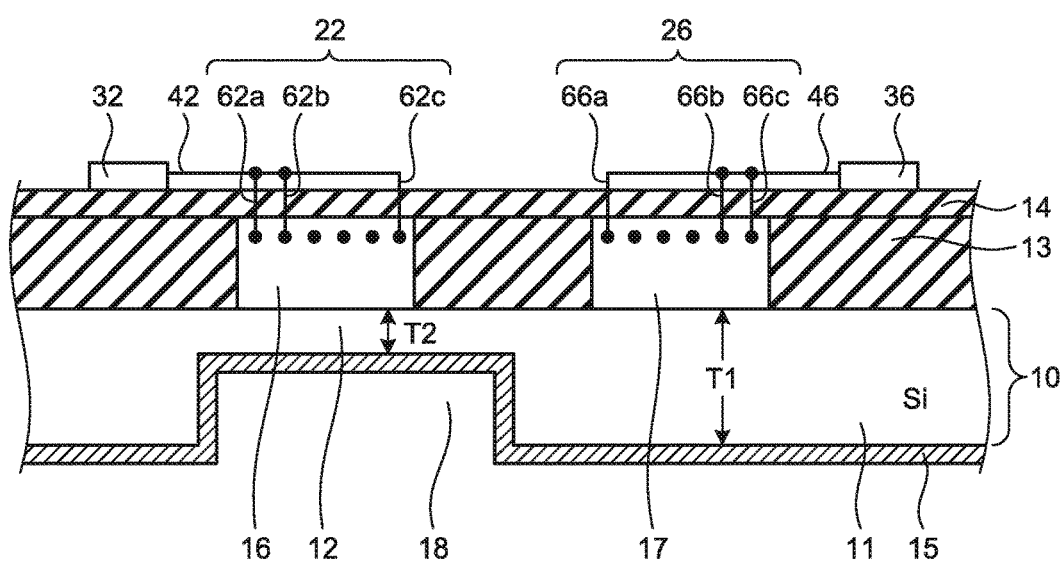
FIG. 2 is a diagram schematically illustrating a cross-sectional structure of a light-receiving device according to a first embodiment.

FIG. 2 is a diagram schematically illustrating a cross-sectional structure of a light-receiving device according to a first embodiment. A cross-sectional structure along I-I in FIG. 1 is illustrated schematically. A silicon semiconductor substrate 10 has a first region 11 with a film thickness T1 and a second region 12 with a film thickness T2. A region with a film thickness T2 is formed by forming a recess 18 on the silicon semiconductor substrate 10. A first film thickness T1 is, for example, approximately 300 µm in order to maintain a strength of a substrate, and a film thickness T2 is appropriately determined for adjustment of a sensitivity of a photoelectric conversion element and is, for example, approximately 8 μm to 10 μm. The dotted line 50 in FIG. 1 corresponds to a region where the recess 18 is formed therein. Therefore, it is possible to form the electrode pads 31 to 38 on a surface of the silicon semiconductor substrate 10 in a region of a peripheral part with a large film thickness thereof that is other than a range that corresponds to a region where the recess 18 is formed therein.

The recess 18 is formed by, for example, selectively etching the silicon semiconductor substrate 10. For example, it is possible to execute its formation by wet etching that uses an etching fluid or Chemical Dry Etching (CDE). For example, it is possible to execute adjustment of a film thickness 12 by adjustment of an etching period of time.

The pixel regions 22, 26 are provided on a principal surface (that may be referred to as a light-receiving surface below) of the silicon semiconductor substrate 10. The pixel regions 22, 26 are formed on, for example, Si epitaxial layers 16, 17 formed by an epitaxial growth method. A silicon oxide film 13 is formed between the respective pixel regions 22, 26. A silicon oxide film 14 as a protective film is formed on a surface of each of the pixel regions 22, 26.

A plurality of photoelectric conversion elements is formed in each of the pixel regions 22, 26. Respective photoelectric conversion elements are connected to wires 42, 46 through wires 62a to 62c, 66a to 66c. The wires 42, 46 are connected to electrode pads 32, 36. A (non-illustrated) quenching resistance is connected to each photoelectric conversion element.

A metal film 15 is formed on a surface (that may be referred to as a back surface below) that is opposite to a principal surface of the silicon semiconductor substrate 10. For the metal film 15, it is possible to use, for example, aluminum, copper, gold, or the like. For example, its formation is executed by using a sputtering method or a plating method. The metal film 15 has a function as a reflective film that reflects incident light toward a side of the pixel regions 22, 26 and a function as a common electrode. Light reflected from the metal film 15 reaches the pixel regions 22, 26, and thereby, it is possible to improve a sensitivity of a photoelectric conversion element. Additionally, as a film thickness T1 is greater than or equal to a certain thickness, light reflected from the metal film 15 is absorbed by the silicon semiconductor substrate 10 and does not reach the pixel region 26.

In other words, a film thickness of the silicon semiconductor substrate 10 where a pixel region is formed thereon is selected appropriately, and thereby, it is possible to adjust a sensitivity of each photoelectric conversion element that is provided thereon. A sensitivity of a photoelectric conversion element formed in the second region 12 is high, and hence, it is possible to detect light from a measurement object at a long distance from the light-receiving device 1. Hereinafter, conveniently, a pixel region provided in the second region 12 may be referred to as a pixel region for a long distance and a pixel region provided in the first region 11 may be referred to as a pixel region for a short distance.

Figure 3:
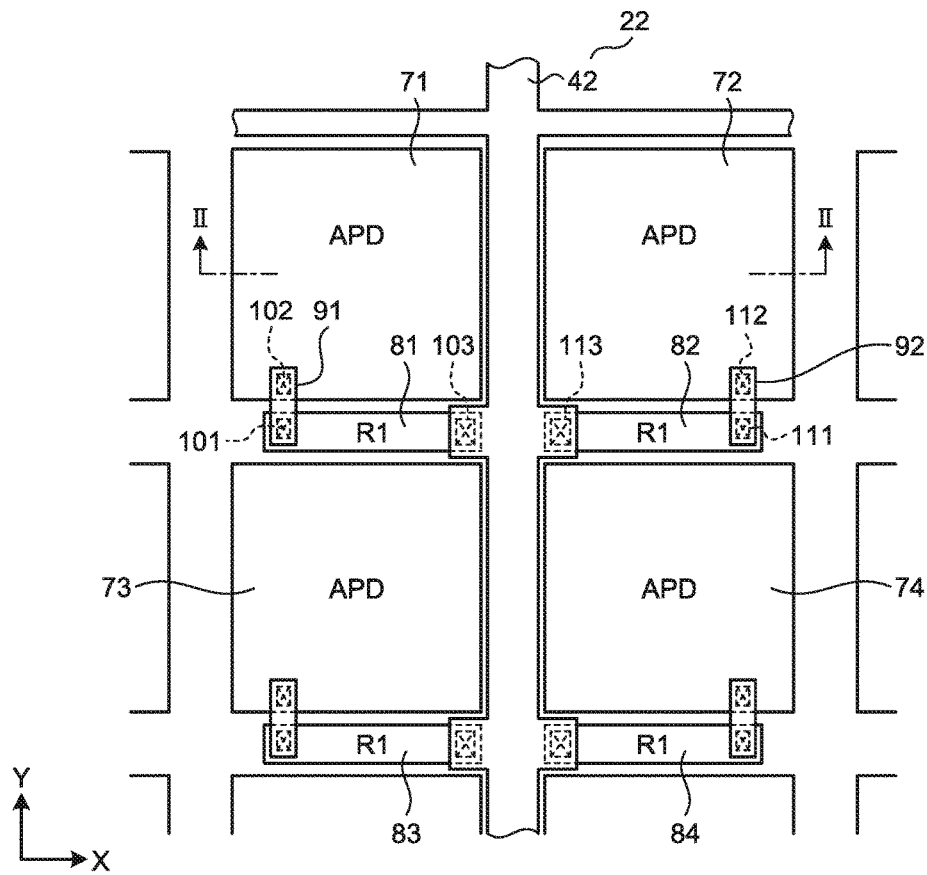
FIG. 3 is a plan view schematically illustrating a part of a pixel region of a light-receiving device according to a first embodiment.

FIG. 3 is a plan view schematically illustrating a part of a pixel region of a light-receiving device according to a first embodiment. For one example, a configuration of a part of the pixel region 22 is illustrated. Photoelectric conversion elements 71 to 74 are APDs that operate in a Geiger mode. In a Geiger mode, a reverse bias voltage that is higher than a breakdown voltage is applied between an anode and a cathode of each APD.

Quenching resistances 81 to 84 are connected to the photoelectric conversion elements 71 to 74, respectively. One end of the quenching resistance 81 is connected to a wire 91 through a connection part 101 and the other end is connected to an anode wire 42 through a connection part 103. The wire 91 is electrically connected to an anode of the photoelectric conversion element 71 through a connection part 102.

The quenching resistances 81 to 84 have, in a case where a photon is incident on an APD to cause an electron avalanche, a function that terminates a multiplication function of the APD due to their voltage drops. Resistance values of the quenching resistances 81 to 84 are set at, for example, approximately several hundred kΩ. The quenching resistances 81 to 84 are formed of, for example, a polycrystalline silicon.

Figure 4:
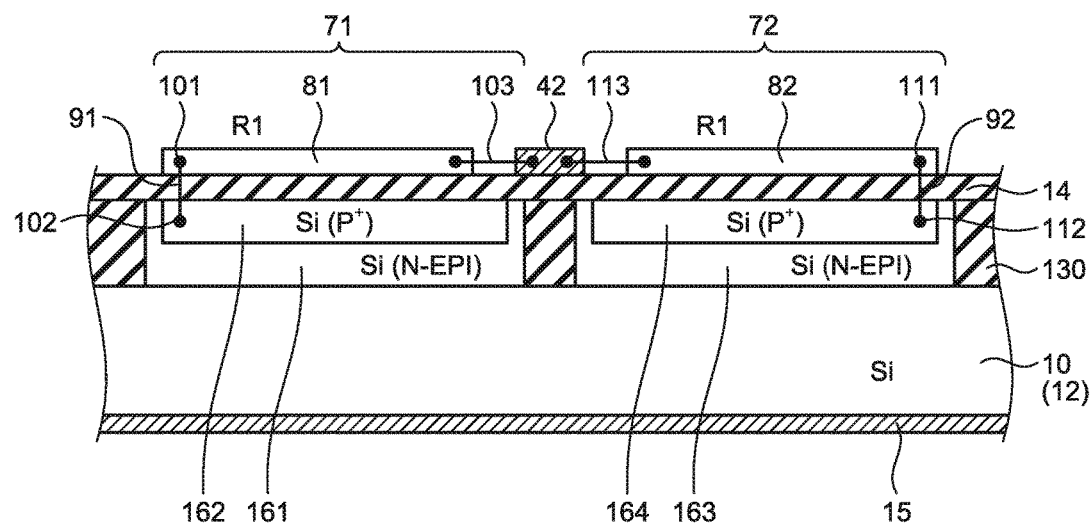
FIG. 4 is a diagram schematically illustrating a cross-sectional structure of a pixel region in FIG. 3.

FIG. 4 is a diagram schematically illustrating a cross-sectional structure of a light-receiving device according to a first embodiment and schematically illustrates a cross-sectional structure along II-II in FIG. 3. That is, a cross-sectional structure of a pixel region is illustrated schematically. A photoelectric conversion element is formed at a side of a light-receiving surface of the silicon semiconductor substrate 10 and the metal film 15 is formed on a side of a back surface thereof. The metal film 15 is used as a cathode electrode.

The photoelectric conversion element 71 has an N-type Si epitaxial layer 161 selectively formed on a principal surface of the silicon semiconductor substrate 10. The N-type Si epitaxial layer 161 has a P-type Si region 162. The N-type Si epitaxial layer 161 and the P-type Si region 162 compose a PN-junction of the photoelectric conversion element 71.

The photoelectric conversion element 72 has an N-type Si epitaxial layer 163 selectively formed on a principal surface of the silicon semiconductor layer 10. The N-type Si epitaxial layer 163 has a P-type Si region 164. The N-type Si epitaxial layer 163 and the P-type Si region 164 compose a PN-junction of the photoelectric conversion element 72. A silicon oxide film 130 defines regions where the N-type Si epitaxial layer 161 and the N-type Si epitaxial layer 163 are formed therein. A silicon oxide film 14 as a protective layer is formed on a surface of each of the photoelectric conversion elements 71, 72.

The P-type Si region 162 is electrically connected to one end of the quenching resistance 81 through the wire 91. One end of the wire 91 is connected to the P-type Si region 162 through the connection part 102 and the other end is connected to one end of the quenching resistance 81 through the connection part 101. The connection parts 101, 102 are formed of through-holes formed in, for example, the silicon oxide film 14 and embedded with a metal material. The wire 91 is illustrated so as to include the connection parts 101, 102. The other end of the quenching resistance 81 is electrically connected to the anode wire 42 through the connection part 103.

The P-type Si region 164 is electrically connected to one end of the quenching resistance 82 through a wire 92. One end of the wire 92 is connected to the P-type Si region 164 through a connection part 112 and the other end is connected to one end of the quenching resistance 82 through a connection part 111. The connection parts 111, 112 are formed of through-holes formed in, for example, the silicon oxide film 14 and embedded with a metal material. The wire 92 is illustrated so as to include the connection parts 111, 112. The other end of the quenching resistance 82 is electrically connected to the anode wire 42 through a connection part 113. Additionally, the quenching resistances 81, 82 are formed at peripheral parts of the N-type Si epitaxial layer 161 and the N-type Si epitaxial layer 163, and conveniently illustrated on top of such epitaxial layers 161, 163 in FIG. 4.

Figure 5:
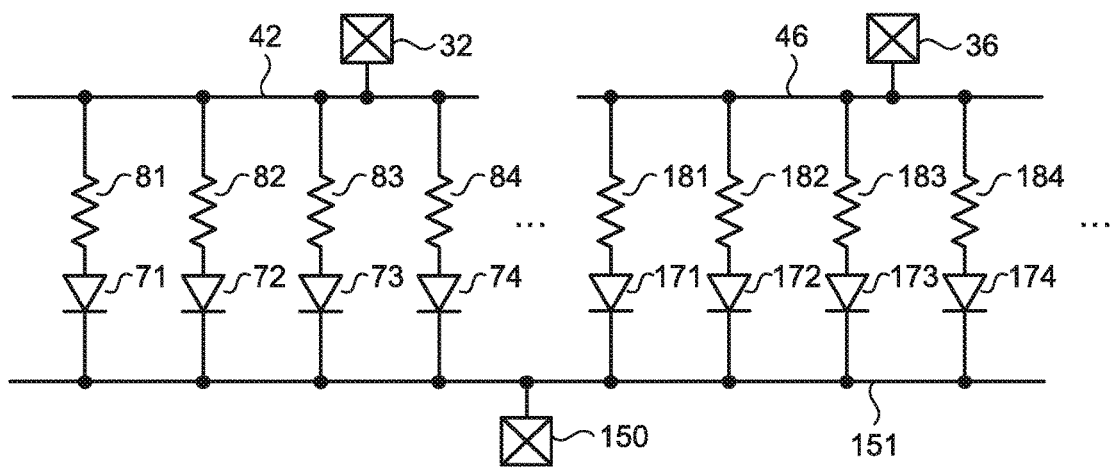
FIG. 5 is a diagram illustrating an equivalent circuit of a part of a light-receiving device according to a first embodiment.

FIG. 5 is a diagram illustrating an equivalent circuit of a part of a light-receiving device according to a first embodiment. A cathode of each of photoelectric conversion elements 71 to 74, 171 to 174 is connected to a cathode electrode 150 through a cathode wire 151. The metal film 15 as illustrated in FIG. 2 is used as the cathode wire 151.

Anodes of the photoelectric conversion elements 71 to 74 are connected to a first anode wire 42 through quenching resistances 81 to 84, respectively. The first anode wire 42 is electrically connected to a first anode electrode pad 32. Anodes of the photoelectric conversion elements 171 to 174 are connected to a second anode wire 46 through quenching resistances 181 to 184, respectively. The second anode wire 46 is electrically connected to a second anode electrode pad 36.

Figure 6:
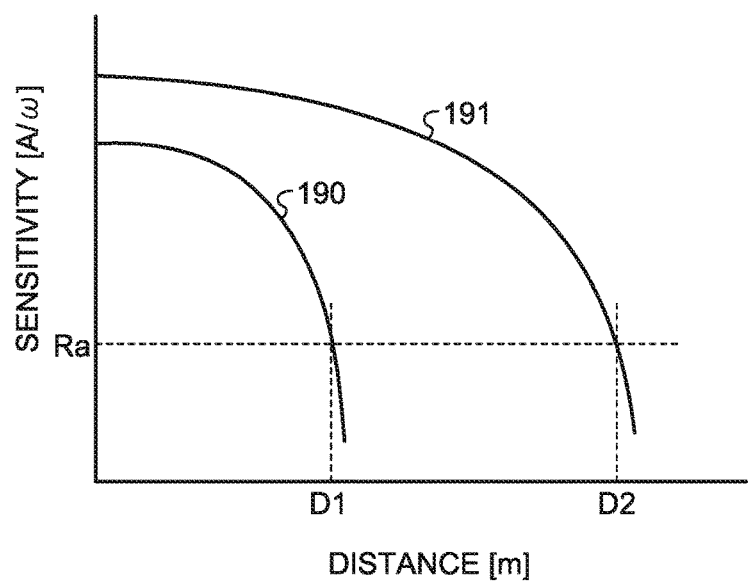
FIG. 6 is a diagram for illustrating a light-receiving characteristic of a light-receiving device according to a first embodiment.

FIG. 6 is a diagram for illustrating a light-receiving characteristic of a light-receiving device according to a first embodiment. A horizontal axis and a vertical axis indicate a distance to a measurement object and a sensitivity, respectively. A characteristic curve 190 indicates a light-receiving characteristic of a photoelectric conversion element formed on a pixel region provided in the first region 11.

As a film thickness T1 is increased, light reflected from the metal film 15 is absorbed in the silicon semiconductor substrate 10, and hence, a sensitivity of a photoelectric conversion element is decreased. For example, a film thickness T1 of the silicon semiconductor substrate 10 where pixel regions for a short distance 25 to 28 are provided thereon is determined in such a manner that it is decreased so as to be less than or equal to a critical sensitivity Ra as a distance to a measurement object is greater than a first set distance D1.

A characteristic curve 191 indicates a light-receiving characteristic of a photoelectric conversion element formed in a pixel region provided in the second region 12. It is provided in a region where a film thickness of the silicon semiconductor substrate 10 is small, and hence, a light-receiving sensitivity thereof is high. That is, incident light is reflected from the metal film 15 and reaches a region where a photoelectric conversion element is formed therein, and hence, light incident on a pixel region is amplified so that a sensitivity of the photoelectric conversion element is high. For example, a film thickness 12 of the silicon semiconductor substrate 10 where the pixel regions for a long distance 21 to 24 are provided thereon is determined in such a manner that it is decreased so as to be less than or equal to a critical sensitivity Ra as a distance to a measurement object is greater than a second set distance D2.

Light-receiving sensitivity of a photoelectric conversion element differs between pixel regions for a long distance and for a short distance, and hence, it is possible to provide a configuration in such a mariner that a photoelectric conversion element to be operated is selected depending on a distance to be measured. For example, it is possible to select and use a photoelectric conversion element for a long distance that has a characteristic curve 191 in a case of measurement for a long distance or select and use a photoelectric conversion element for a short distance that has the characteristic curve 190 in a case of measurement for a short distance. Alternatively, it is also possible to provide a configuration in such a manner that, while a voltage is applied to both photoelectric conversion elements for a long distance and for a sort distance, starting to detect an output signal from a photoelectric conversion element for a short distance is detected to detect that a distance to a measurement object is decreased, and afterward, supply of electric power to a photoelectric conversion element for a long distance is stopped to operate a photoelectric conversion element selectively, so that an electric power consumption is reduced.

According to the present embodiment, a light-receiving device where pixel regions with different sensitivities are provided thereon is provided, and thereby, it is possible to execute multi-functionalization of a light-receiving device. That is, an output from a photoelectric conversion element for a short distance is an output signal that informs that a distance to a measurement object is decreased. That is, pixel regions for a long distance 21 to 24 and pixel regions for a short distance 25 to 28 are provided, so that presence or absence of an output from each photoelectric conversion element provides information of a distance to a measurement object.

The number of stepwise levels of a thickness of the silicon semiconductor substrate 10 is increased, and thereby, it is possible to further improve a functionality thereof. A signal that is output from each of pixel regions with different film thicknesses is detected sequentially, and thereby, it is possible to detect that a distance to a measurement object is decreased gradually.

It is also possible to provide a configuration in such a manner that a material of a pixel region is changed in addition to adjustment of a thickness of a silicon semiconductor substrate. For example, a photoelectric conversion element may be formed in such a manner that a semiconductor material for forming a pixel region for a long distance is composed of a semiconductor material with a bandgap less than that of silicon. Thereby, it is possible to obtain a photoelectric conversion element with a high sensitivity to a light source with a long wavelength. A film thickness of a silicon semiconductor substrate is reduced and a pixel region is composed of a material with a small bandgap, so that it is possible to further improve a sensitivity of a photoelectric conversion element for a long distance, and hence, it is possible to further increase a measurable distance.

For a semiconductor material with a small bandgap, it is possible to use, for example, germanium (Ge). For example, it is possible to selectively form an epitaxial layer of silicon (Si) and Ge on a surface of the silicon semiconductor substrate 10 by a selective epitaxial method.

It is possible to use the metal film 15 as a common electrode of the light-receiving device 1. Furthermore, it is possible to adjust a sensitivity characteristic for each pixel by merely changing a thickness of the silicon semiconductor substrate 10 in a pixel region, and hence, adjustment of a sensitivity of a photoelectric conversion element is facilitated. Moreover, it is possible to reduce a cost by using a silicon semiconductor substrate that is generally used. Furthermore, a film thickness of the silicon semiconductor substrate 10 at a peripheral part thereof is increased, and a bonding pad is formed in such a region. It is possible to increase a strength of a region where a bonding pad is formed therein, and hence, a strength of bonding in a case where a bonding wire is connected is increased so that manufacturing is facilitated.

Second Embodiment

Figure 7:
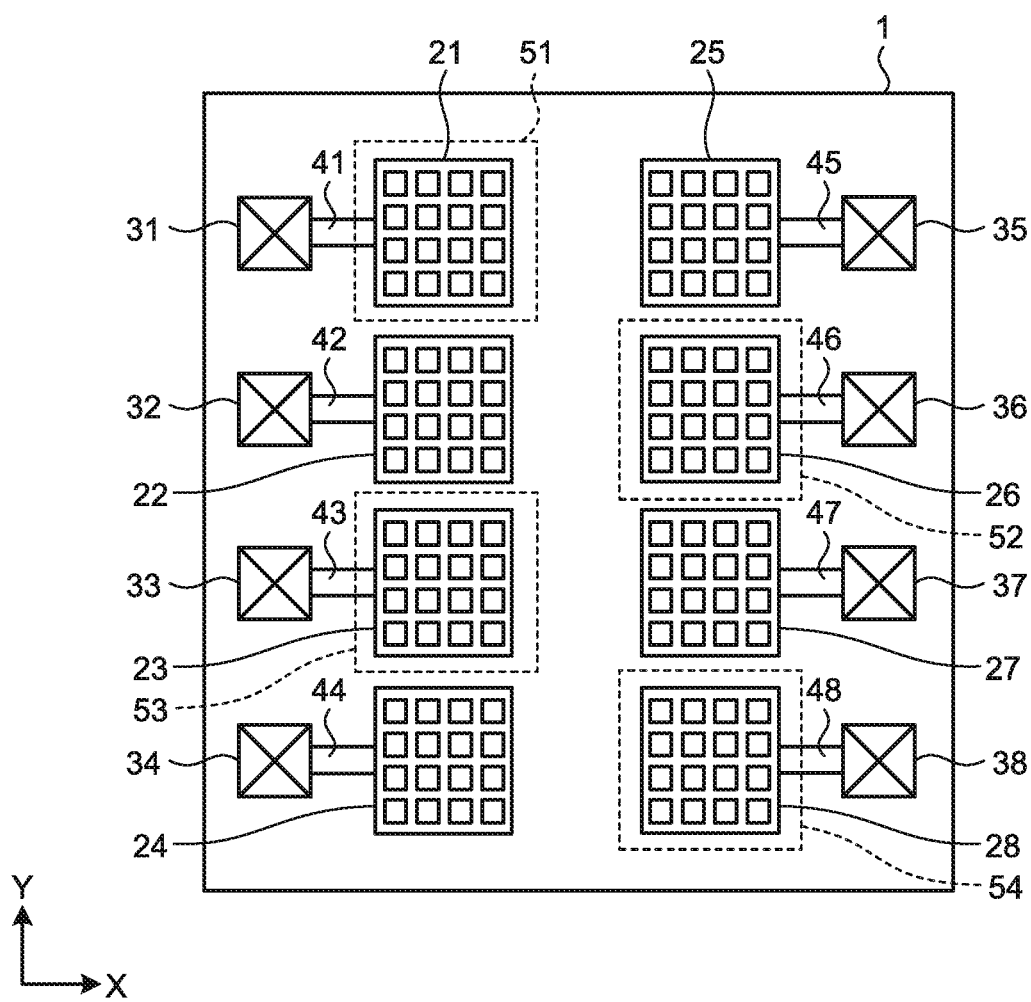
FIG. 7 is a plan view schematically illustrating a light-receiving device according to a second embodiment.

In an embodiment as illustrated in FIG. 7, regions with a small film thickness as indicated by dotted lines 51 to 54 and regions with a large film thickness are arranged in a staggered manner. That is, pixel regions for a long distance 21, 23, 26, and 28 and pixel regions for a short distance 22, 24, 25, and 27 are alternately arranged in directions of an X-axis and a Y-axis that is orthogonal thereto. Therefore, in the present embodiment, for example, a relationship between film thicknesses of pixel regions 22 and 26 is different from a relationship as illustrated in FIG. 2, and a film thickness of the silicon semiconductor substrate 10 in a region where the pixel region 22 is formed therein is greater than a film thickness of the silicon semiconductor substrate 10 in a region where the pixel region 26 is formed therein.

Photoelectric conversion elements with different sensitivities are uniformly arranged over a whole of a light-receiving surface, and hence, it is possible to detect incident light without bias thereof. Furthermore, it is possible to avoid concentrating of regions with a small film thickness on a part of the silicon semiconductor substrate 10, and for example, it is possible to avoid a negative effect where a region with a small film thickness is distorted and deformed.

Third Embodiment

Figure 8:
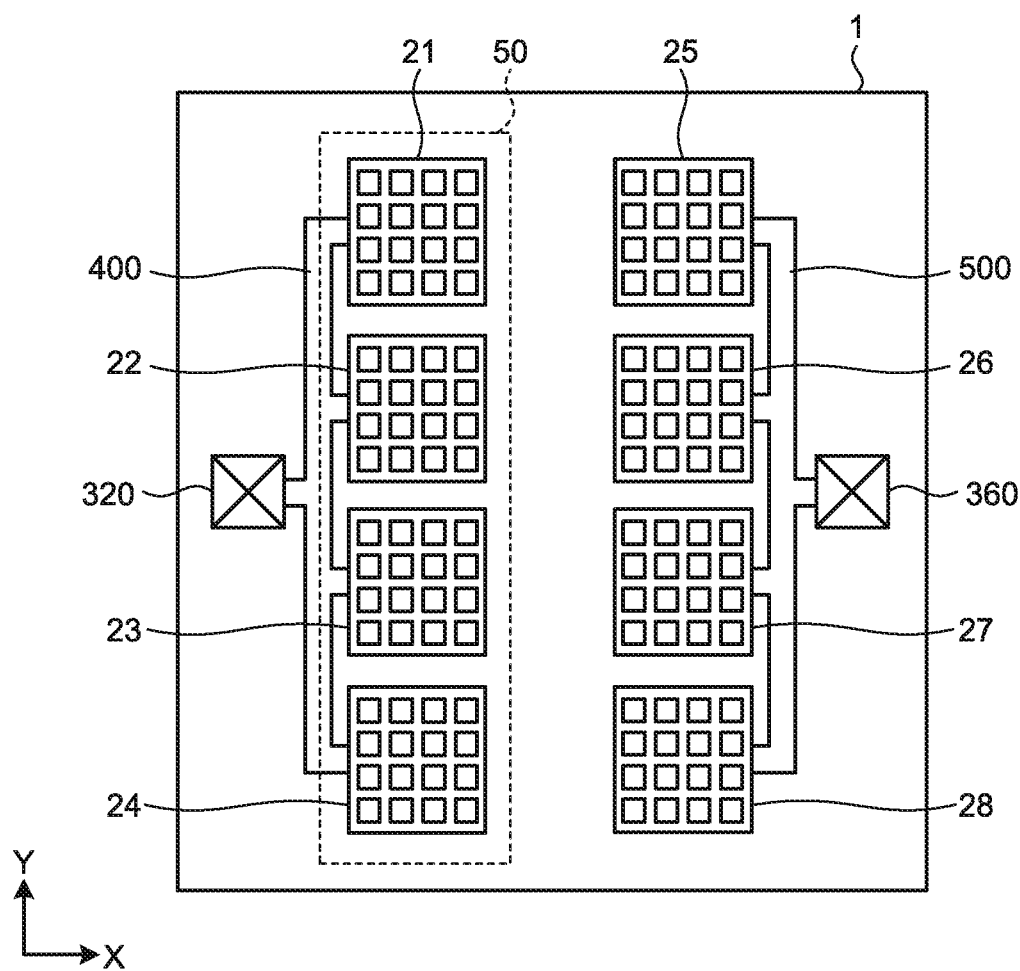
FIG. 8 is a plan view schematically illustrating a light-receiving device according to a third embodiment.

FIG. 8 is a plan view schematically illustrating a light-receiving device according to a third embodiment. Similarly to the first embodiment, a film thickness of the silicon semiconductor substrate 10 in a region indicated by a dotted line 50 is less than that in another region. The present embodiment includes a first common electrode pad 320 where an output signal from a photoelectric conversion element formed in a pixel region with a small film thickness is supplied thereto through a wire 400, and a second common electrode pad 360 where an output signal from a photoelectric conversion element formed in a pixel region with a large film thickness is supplied thereto through a wire 500.

According to the present embodiment, a signal from a photoelectric conversion element for a long distance is supplied to the first common electrode pad 320, and an output signal from a photoelectric conversion element for a short distance is supplied to the second common electrode pad 360. Therefore, output signals from the first common electrode pad 320 and the second common electrode pad 360 are detected, and thereby, it is possible to understand a situation of a distance to a measurement object. For example, a voltage drop that is produced by a (non-illustrated) resistance connected to each of the common electrode pads 320, 360 is detected, and thereby, it is possible to provide a configuration in such a manner that presence or absence of an output signal from a photoelectric conversion element is detected. It is also possible to selectively operate photoelectric conversion elements for a long distance and for a short distance. One of the first common electrode pad 320 and the second common electrode pad 360 is selected and a photoelectric conversion element to be operated are limited to a photoelectric conversion element connected to a selected electrode pad 320, 360, so that it is possible to reduce electric power consumption.

Figure 9:
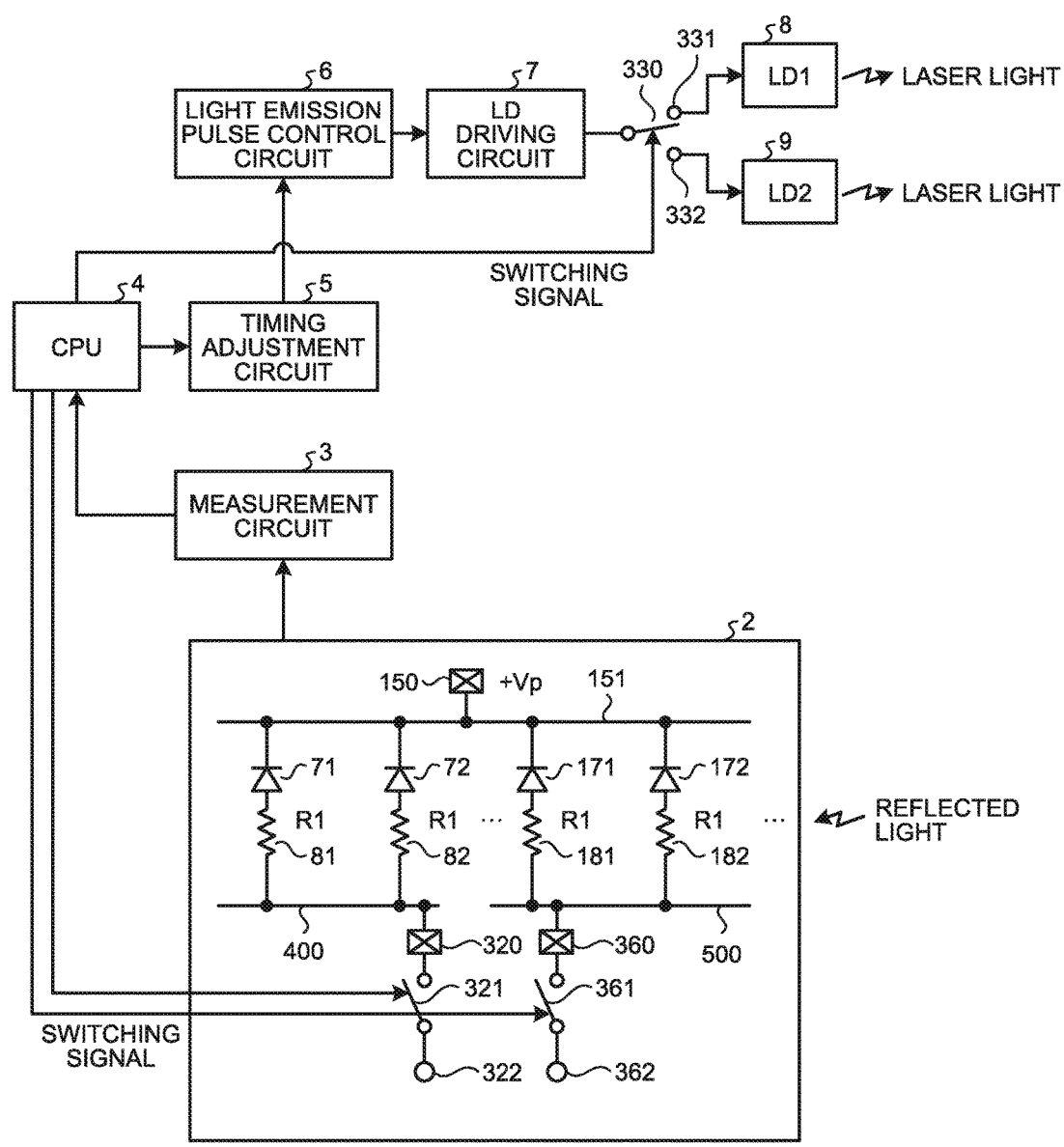
FIG. 9 is a diagram illustrating a configuration of a photo-detection apparatus that uses a light-receiving device according to a third embodiment.

FIG. 9 is a configuration diagram of a photo-detection apparatus that uses the light-receiving device according to the third embodiment. A photo-detection apparatus has a central processing unit (CPU) 4 that controls an operation of photo-detection, a timing adjustment circuit 5, a light emission pulse control circuit 6, an LD driving circuit 7, a switch 330, light emission sources with different wavelengths 8, 9, a measurement circuit 3, and a light-receiving part 2. The CPU 4 controls the timing adjustment circuit 5. The timing adjustment circuit 5 controls the light emission pulse control circuit 6. The LD driving circuit 7 outputs a driving signal in response to an output signal of the light emission pulse control circuit 6.

An output signal of the LD driving circuit 7 is selectively supplied to the first light emission source 8 or the second light emission source 9 through the switch 330. A connection end of the switch 330 is switched between switching terminals 331, 332 by a switching signal from the CPU 4. For example, the first light emission source 8 is an infrared laser diode and the second light emission source 9 is a red laser diode. The first light emission source 8 and the second light emission source 8 are selected, and thereby, it is possible to emit light with different wavelengths.

Light is emitted from the first light source 8 or the second light source 9 and light reflected from a measurement object is detected by the light-receiving part 2. As a photon is detected by the light-receiving part 2, its amplification is executed by the photoelectric conversion elements 71, 72, 171, 172 that operate in Geiger mode and a detection signal is output. For example, it is possible to output, as a detection signal(s), a voltage drop(s) that is/are produced by a (non-illustrated) resistance(s) that is/are connected to the cathode electrode 150 or the first and second common electrode pads 320, 360 that are used as anode electrodes. A detection signal is supplied to the measurement circuit 3.

A voltage Vp on a side of a higher electric potential is applied to the cathode electrode 150. Switches 321, 361 are provided between the first common electrode pad 320 and a first output end 322 and between the second common electrode pad 360 and a second output end 362. The switches 321, 361 are switched by a switching signal from the CPU 4 and the first or second common electrode pad 320, 360 is selected and electrically connected to the cathode electrode 150. Thereby, it is possible to selectively operate photoelectric conversion elements for a long distance 71, 72 and photoelectric conversion elements for a short distance 171, 172.

In the present photo-detection apparatus, for example, in a case of a long distance, the first light emission source 8 with a long wavelength is used and a photoelectric conversion element for a long distance is selected on the light-receiving part 2. A photoelectric conversion element that is operated in the light-receiving part 2 is selected depending on a wavelength of a light emission source to be used, and thereby, it is possible to reduce electric power consumption.

Additionally, both the first common electrode pad 320 and the second common electrode pad 360 are connected to the cathode electrode 150 by the switches 321, 361, and both of photoelectric conversion elements for a long distance and for a short distance 71, 72, 171, 172 may be operated at a time of start of distance measurement. For example, an output from a photoelectric conversion element for a short distance is detected, and thereby, it is possible to detect that a distance to a measurement object is small. After a small distance is detected, for example, the switch 321 is turned off to stop supply of electric power to the photoelectric conversion elements 71, 72 formed in a pixel region for a long distance, and thereby, it is possible to reduce electric power consumption.

According to the present embodiment, an output signal from each of the photoelectric conversion elements 71, 72, 171, 172 is detected by using the light-receiving device 1 where pixel regions for a long distance and for a short distance are provided on the light-receiving part 2, and thereby, it is possible to obtain information of a distance to a measurement object, so that functionality of a distance measurement system is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-receiving device, comprising:
a semiconductor substrate that includes a first pixel region that has a first thickness and a second pixel region that has a second thickness less than the first thickness and that has a first surface and a second surface;
a plurality of first photoelectric conversion elements formed on the first surface in the first pixel region;
a first electrode where an output of the first photoelectric conversion element is supplied thereto;
a plurality of second photoelectric conversion elements formed on the first surface in the second pixel region;
a second electrode where an output of the second photoelectric conversion element is supplied thereto; and
a metal film that is formed on the second surface of the semiconductor substrate and used as a common electrode for the first and second photoelectric conversion elements.

2. The light-receiving device according to claim 1, wherein the second photoelectric conversion element is configured to includes a semiconductor material with a bandgap less than that of a semiconductor material that composes the first photoelectric conversion element.

3. The light-receiving device according to claim 2, wherein
a semiconductor material that composes the first photoelectric conversion element is silicon, and
the semiconductor material with a less bandgap is germanium.

4. The light-receiving device according to claim 2, wherein a second surface of the semiconductor substrate has a recess at a position that corresponds to the second pixel region.

5. The light-receiving device according to claim 4, comprising:
a first bonding pad that is connected to the plurality of photoelectric conversion elements formed in the first pixel region and composes the first electrode; and
a second bonding pad that is connected to the plurality of photoelectric conversion elements formed in the second pixel region and composes the second electrode;
on a first surface of the semiconductor substrate other than a range that corresponds to a region where the recess is formed therein.

6. The light-receiving device according to claim 1, wherein the semiconductor substrate includes:
a silicon semiconductor substrate that has regions where film thicknesses thereof are adjusted to correspond to the first pixel region and the second pixel region; and
epitaxial layers formed on a surface of the silicon semiconductor substrate to correspond to the first pixel region and the second pixel region.

7. The light-receiving device according to claim 1, wherein the first pixel region and the second pixel region are alternately provided in two orthogonal directions of the semiconductor substrate.

8. The light-receiving device according to claim 7, comprising:
a first bonding pad that is formed on the first surface at a peripheral part of the semiconductor substrate and composes the first electrode; and
a second bonding pad that is formed on the first surface at a peripheral part of the semiconductor substrate and composes the second electrode.

9. The light-receiving device according to claim 1, wherein
outputs of the plurality of first photoelectric conversion elements are supplied to the first electrode, and
outputs of the plurality of second photoelectric conversion elements are supplied to the second electrode.

10. The light-receiving device according to claim 1, wherein
a plurality of the first pixel regions is sequentially provided in one direction among two orthogonal directions of the semiconductor substrate, and
a plurality of the second pixel regions is sequentially provided in the one direction.

11. The light-receiving device according to claim 10, comprising:
a first bonding pad formed on the plurality of first pixel regions where outputs of the plurality of first photoelectric conversion elements are supplied thereto;
a second bonding pad formed on the plurality of second pixel regions where outputs of the plurality of second photoelectric conversion elements are supplied thereto;
on the first surface at a peripheral part of the semiconductor substrate.

12. The light-receiving device according to claim 1, wherein the second surface of the semiconductor substrate has a recess at a position that corresponds to the second pixel region.

13. The light-receiving device according to claim 12, wherein the first pixel region and the second pixel region are alternately provided in two orthogonal directions of the semiconductor substrate.

14. The light-receiving device according to claim 13, comprising:
a first bonding pad that is connected to a plurality of photoelectric conversion elements formed in the first pixel region and composes the first electrode; and
a second bonding pad that is connected to a plurality of photoelectric conversion elements formed in the second pixel region and composes the second electrode;
on a first surface of the semiconductor substrate other than a range that corresponds to a region where the recess is formed therein.

15. The light-receiving device according to claim 1, comprising:
a first resistance that is connected between the first photoelectric conversion element and the first electrode and has a function that terminates a multiplication function of the first photoelectric conversion element in a case where a photon is incident thereon to cause an electron avalanche; and
a second resistance that is each connected between the second photoelectric conversion element and the second electrode and has a function that terminates a multiplication function of the second photoelectric conversion element in a case where a photon is incident thereon to cause an electron avalanche.

16. A photo-detection apparatus, comprising:
the light-receiving device according to claim 1;

a measurement circuit that measures an output signal from the light-receiving device;

first and second light emission sources with different light emission wavelengths;

a driving part that drives the first and second light emission sources; and a selection part that selectively operates the plurality of first and second photoelectric conversion elements formed in the first and second pixel regions of the light-receiving device.

17. The photo-detection apparatus according to claim 16, wherein, in a case where the driving part switches between and drives the first and second light emission sources, the selection part switches between and operates the plurality of first photoelectric conversion elements formed in the first pixel region and the plurality of second photoelectric conversion elements formed in the second pixel region depending on switching between the first and second light emission sources.

18. The photo-detection apparatus according to claim 17, wherein the first light emission source includes an infrared laser diode, the second light emission source includes a red laser diode, and in a case where the driving part selects and drives the first light emission source, the selection part selects and operates the plurality of second photoelectric conversion elements formed in the second pixel region.

19. The photo-detection apparatus according to claim 16, wherein, in a case where the measurement circuit detects an output signal from the first pixel region, the selection part stops supply of electric power to the plurality of second photoelectric conversion elements formed in the second pixel region.

* * * * *